United States Patent
Takase

(10) Patent No.: US 8,902,382 B2
(45) Date of Patent: Dec. 2, 2014

(54) LIGHT EMITTING DIODE ELEMENT, LIGHT SOURCE DEVICE, SURFACE LIGHT SOURCE ILLUMINATION DEVICE, AND LIQUID CRYSTAL DISPLAY DEVICE

(75) Inventor: Kenji Takase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 256 days.

(21) Appl. No.: 13/513,689

(22) PCT Filed: Nov. 26, 2010

(86) PCT No.: PCT/JP2010/071165
§ 371 (c)(1),
(2), (4) Date: Jun. 4, 2012

(87) PCT Pub. No.: WO2011/077900
PCT Pub. Date: Jun. 30, 2011

(65) Prior Publication Data
US 2012/0242933 A1  Sep. 27, 2012

(30) Foreign Application Priority Data
Dec. 22, 2009  (JP) .................... 2009-291302

(51) Int. Cl.
*G02F 1/1335* (2006.01)
*H01L 33/64* (2010.01)
*H01L 33/60* (2010.01)
*H01L 25/075* (2006.01)
*H01L 33/48* (2010.01)
*H01L 33/62* (2010.01)

(52) U.S. Cl.
CPC ............. *H01L 33/647* (2013.01); *H01L 33/60* (2013.01); *G02F 1/133603* (2013.01); *H01L 25/0753* (2013.01); *H01L 33/486* (2013.01); *H01L 33/62* (2013.01); *H01L 2224/48465* (2013.01)

USPC ......... 349/69; 362/97.3; 362/249.02; 257/98; 313/499

(58) Field of Classification Search
USPC ................. 349/69; 362/249.02, 97.3; 257/98; 313/499
See application file for complete search history.

(56) References Cited

U.S. PATENT DOCUMENTS

| | | | |
|---|---|---|---|
| 2006/0164836 A1* | 7/2006 | Suehiro et al. | 362/294 |
| 2007/0063209 A1* | 3/2007 | Sugiura et al. | 257/98 |
| 2007/0230173 A1* | 10/2007 | Kim | 362/249 |
| 2009/0302344 A1* | 12/2009 | Inoguchi | 257/98 |
| 2011/0169037 A1* | 7/2011 | Hasegawa et al. | 257/98 |

FOREIGN PATENT DOCUMENTS

| | | |
|---|---|---|
| JP | 2004-039691 A | 2/2004 |
| JP | 2004-200208 A | 7/2004 |
| JP | 2006-128512 A | 5/2006 |
| JP | 2006-190814 A | 7/2006 |
| JP | 2007-317701 A | 12/2007 |
| JP | 2009-295798 A | 12/2009 |

OTHER PUBLICATIONS

Official Communication issued in International Patent Application No. PCT/JP2010/071165, mailed on Dec. 21, 2010.

\* cited by examiner

*Primary Examiner* — Michael Caley
(74) *Attorney, Agent, or Firm* — Keating & Bennett, LLP

(57) ABSTRACT

The present invention includes: a heat dissipation plate (4) that has an upper surface on which an LED chip (3) is provided and that dissipates heat generated by the LED chip (3); a reflecting plate (7) for reflecting light emitted from the LED chip (3); and a substrate (2) provided between the heat dissipation plate (4) and the reflecting plate (7), the heat dissipation plate (4) and the reflecting plate (7) being integrally formed by bonding at a bonding section (12), the heat dissipation plate (4) and the substrate (2) being bonded to each other at a bonding section (20), the heat dissipation plate (4) and the reflecting plate (7) each having a surface covered by a conductor pattern (13).

8 Claims, 12 Drawing Sheets

(a)

(b)

ically, the LED chip 103 contained in the LED element) to generate heat. This in turn decreases the luminous efficiency of the LED element 101 itself, and thus darkens light
LIGHT EMITTING DIODE ELEMENT, LIGHT SOURCE DEVICE, SURFACE LIGHT SOURCE ILLUMINATION DEVICE, AND LIQUID CRYSTAL DISPLAY DEVICE

TECHNICAL FIELD

The present invention relates to a light emitting diode element, a light source device, a surface light source illumination device, and a liquid crystal display device.

BACKGROUND ART

There has been conducted development of an LED element for use in, for example, a backlight device of a liquid crystal display or a light source of illumination equipment or the like. FIG. 12 shows explanatory diagrams each illustrating a conventional LED element 101. (a) of FIG. 12 is a cross-sectional view of the conventional LED element 101. (b) of FIG. 12 is a plan view of the conventional LED element 101. (c) of FIG. 12 is a graph illustrating an electrical characteristic of the conventional LED element 101.

The LED element 101 includes: a substrate (base material) 102; an LED (light emitting diode) chip 103; an anode terminal 104; a cathode terminal 105; through holes 106 and 107; conductor patterns 108 and 109; a bonding wire 110; and a sealing resin 111.

The LED element 101 is structured as follows: The LED chip 103 is mounted on the conductor pattern 108 on the substrate 102. The anode terminal 104 and the conductor pattern 108 are connected to each other via the through hole 106 penetrating through the substrate 102.

The cathode terminal 105 and the conductor pattern 109 are connected to each other via the through hole 107 penetrating through the substrate 102. The LED chip 103 and the conductor pattern 109 are connected to each other via the bonding wire 110. The LED chip 103 and the conductor patterns 108 and 109 are covered by the sealing resin 111 for sealing.

Patent Literature 1 discloses an LED element including an LED chip as in the LED element 101 of FIG. 12. This LED element is characteristically so structured that (i) heat generated by the LED chip is dissipated to a metal surface on the back side and that (ii) a frame member, which is a part of an LED lens, can be adhered at no slant.

CITATION LIST

Patent Literature 1

Japanese Patent Application Publication, Tokukai, No. 2004-200208 A (Publication Date: Jul. 15, 2004)

SUMMARY OF INVENTION

Technical Problem

The LED element 101 of FIG. 12, in the case where it is used for illumination, requires a large current therethrough in order to emit light having a high luminous intensity.

The LED element 101 emits light having a luminous intensity (unit: cd [candela]) that basically becomes higher in proportion to the amount of a current ("LED CURRENT" in (c) of FIG. 12) through the LED element 101. A large amount of that current, however, causes the LED element 101 (more specifically, the LED chip 103 contained in the LED element) to generate heat. This in turn decreases the luminous efficiency of the LED element 101 itself, and thus darkens light emitted by the LED element (that is, the luminance is decreased; see the graph of (c) of FIG. 12). As a reference value, an LED maximum rated current through the LED element 101 decreases the luminous intensity by approximately 10% to 20%.

Further, using the LED element for an extended period of time in the state in which it is generating heat degrades the LED element 101 itself and reduces its life, possibly breaking the LED element. The description below deals with a cause for a decrease in the luminous efficiency of the LED element 101 itself.

A larger amount of a current through the LED element 101 causes the LED chip 103 to generate a larger amount of heat, and leads to a greater package damage (heat dissipation property) for the LED element 101. Thus, a decrease in the luminous efficiency of the LED chip 103 itself decreases the luminous efficiency of the LED element 101 itself.

Specifically, a part of the LED element 101 which part generates heat is a PN junction section in the LED chip 103 sealed in the LED element 101 with the sealing resin 111. This PN junction section, with no cooling time, continues to heat up over time.

Due to the above cause, the luminous efficiency of an LED element itself is changed according to (i) a package damage (heat dissipation property) for the LED element and (ii) the heat dissipation property of the vicinity of a mount section of the LED element.

The LED element of Patent Literature 1, which causes heat generated by the LED chip to dissipate to a metal surface on the back side, poses first to third problems below.

The first problem is as follows: Heat generated by the LED chip cannot be dissipated sufficiently merely with use of a metal plate on which the LED chip is mounted.

The second problem is as follows: Since a surface around the LED chip includes a layered structure of, for example, a resist and an adhesive, such a layered structure has a surface that is too low in reflectance to sufficiently reflect, by a cross section thereof, light emitted from the LED chip side, and thus involves a large reflection loss. Thus, the luminous efficiency of this LED element is decreased with respect to the amount of light emitted by the LED chip.

The third problem is as follows: This LED element emits light having a distribution (light distribution) that is high in light condensation and very high in directivity. Thus, it is difficult to control light of this LED element in such a manner that the light has a converse distribution, for example, a particular, wide light distribution (which is low in light focusing property and in directivity).

The present invention has been accomplished in view of the above problems with conventional art. It is an object of the present invention to provide: a light emitting diode element that has (i) an adjustable orientation distribution, (ii) high heat dissipation and high luminous efficiency, and (iii) a life longer than that of a conventional light emitting diode element; a light source device; a surface light source illumination device; and a liquid crystal display device.

Solution to Problem

In order to solve the above problems, a light emitting diode element of the present invention is a surface-emission light emitting diode element including: a light-emitting diode chip; a heat dissipation plate that has an upper surface on which the light-emitting diode chip is provided and that dissipates heat generated by the light-emitting diode chip; a reflecting plate for reflecting light emitted from the light-emitting diode chip; and a substrate provided between the heat dissipation plate and the reflecting plate, the heat dissipation plate and the reflecting plate being integrally formed by bonding at a first bonding section, the heat dissipation plate and the substrate being bonded to each other at a second bonding section, the heat dissipation plate and the reflecting plate having respective surfaces both covered by a conductor pattern.

According to the above arrangement, the light emitting diode element is a light emitting diode element including the heat dissipation plate and the reflecting plate for reflecting light emitted from the light-emitting diode chip. This structure allows light emitted from the light-emitting diode chip to be reflected efficiently, and also allows the light distribution (that is, the distribution of the light emitted from the light emitting diode element) to be adjusted by adjusting (that is, increasing or decreasing) the angle formed by (i) the normal line direction (that is, the direction perpendicular to an exposed surface of the heat dissipation plate) and (ii) the reflecting plate.

The heat dissipation plate and the reflecting plate each have a surface covered by the conductor pattern, which is made of copper or the like. The reflecting plate and the exposed surface of the heat dissipation plate are bonded to each other at the first bonding section, whereas the heat dissipation plate and the substrate are bonded to each other at the second bonding section. The first bonding section and the second bonding section increase the volume of a heat dissipation section over that for a conventional light emitting diode element, and thus increases the heat capacity over that for a conventional light emitting diode element. The above arrangement increases heat dissipation with use of a synergistic effect of (i) the heat dissipation effect by the first bonding section and (ii) the heat dissipation effect by the second bonding section.

The above light emitting diode element, which can dissipate heat efficiently as described above, can prevent heat from being present locally and thus disperse heat.

The light emitting diode element dissipates heat through the heat dissipation plate and the reflecting plate, which are located in the vicinity of the light-emitting diode chip. The light emitting diode element, which is larger in metal area than a conventional light emitting diode element, has an accordingly improved heat dissipation property.

The light emitting diode element can thus further prevent heat generation than by a conventional light emitting diode element. The light emitting diode element consequently has an increased luminous efficiency. In other words, the light emitting diode element is higher in luminous efficiency. Further, since the light emitting diode element can prevent heat generation, the light emitting diode element has a life longer than that of a conventional light emitting diode element.

The above arrangement, as a result, makes it possible to provide a light emitting diode element that has (i) an adjustable orientation distribution, (ii) high heat dissipation and high luminous efficiency, and (iii) a life longer than that of a conventional light emitting diode element.

Advantageous Effects of Invention

As described above, a light emitting diode element of the present invention includes: a heat dissipation plate that has an upper surface on which the light-emitting diode chip is provided and that dissipates heat generated by the light-emitting diode chip; a reflecting plate for reflecting light emitted from the light-emitting diode chip; and a substrate provided between the heat dissipation plate and the reflecting plate, the heat dissipation plate and the reflecting plate being integrally formed by bonding at a first bonding section, the heat dissipation plate and the substrate being bonded to each other at a second bonding section, the heat dissipation plate and the reflecting plate having respective surfaces both covered by a conductor pattern.

The above arrangement makes it possible to advantageously provide: a light emitting diode element that has (i) an adjustable orientation distribution, (ii) high heat dissipation and high luminous efficiency, and (iii) a life longer than that of a conventional light emitting diode element; a light source device; a surface light source illumination device; and a liquid crystal display device.

BRIEF DESCRIPTION OF DRAWINGS

FIG. 1 shows explanatory views each illustrating an LED element of an Example of the present invention, where (a) is a cross-sectional view of the LED element of the Example of the present invention, and (b) is a plan view of the LED element of the Example of the present invention.

FIG. 2 shows explanatory diagrams each illustrating the LED element of the Example of the present invention, where (a) is a diagram illustrating how heat is dissipated in the LED element of the Example of the present invention, and (b) is a partial enlarged view of the LED element, the partial enlarged view illustrating a light-emitting surface of an LED chip.

FIG. 3 is a graph illustrating how the LED element of the Example of the present invention has an increased luminous efficiency.

FIG. 4 shows explanatory diagrams each illustrating a light distribution for a case in which the LED element of the Example of the present invention involves a smaller angle, where (a) is a graph illustrating a light distribution for a case in which the LED element of the Example of the present invention involves a smaller angle as illustrated in (b).

FIG. 5 shows explanatory diagrams each illustrating a light distribution for a case in which the LED element of the Example of the present invention involves a larger angle, where (a) is a graph illustrating a light distribution for a case in which the LED element of the Example of the present invention involves a larger angle as illustrated in (b).

FIG. 6 shows explanatory views each illustrating an LED element of a second Example of the present invention, where (a) is a cross-sectional view of the LED element of the second Example of the present invention, and (b) is a plan view of the LED element of the second Example of the present invention.

FIG. 7 shows explanatory views each illustrating an LED element of a third Example of the present invention, where (a) is a cross-sectional view of the LED element of the third Example of the present invention, and (b) is a plan view of the LED element of the third Example of the present invention.

FIG. 8 shows explanatory views each illustrating an LED element of a fourth Example of the present invention, where (a) is a cross-sectional view of the LED element of the fourth Example of the present invention, and (b) is a plan view of the LED element of the fourth Example of the present invention.

FIG. 9 shows explanatory views each illustrating an LED element of a fifth Example of the present invention, where (a) is a cross-sectional view of the LED element of the fifth Example of the present invention, (b) is a partial enlarged view of a portion of the LED element of the fifth Example of the present invention which portion has been subjected to a surface roughening treatment, and (c) is a plan view of the LED element of the fifth Example of the present invention.

FIG. 10 shows explanatory views each illustrating a light source including a plurality of LED elements provided on an identical substrate, where (a) is a cross-sectional view illustrating a light source including a plurality of LED elements provided on an identical substrate, and (b) is a plan view of the light source.

FIG. 11 is a cross-sectional view illustrating a surface light source illumination device and a liquid crystal display device each according to a seventh Example of the present invention.

FIG. 12 shows explanatory diagrams each illustrating a conventional LED element, where (a) is a cross-sectional view of the conventional LED element, (b) is a plan view of the conventional LED element, and (c) is a graph illustrating an electrical characteristic of the conventional LED element.

DESCRIPTION OF EMBODIMENTS

An embodiment of the present invention is described below on the basis of Examples 1 through 7 with reference to FIGS. 1 through 11.

EXAMPLE 1

An Example of the present invention is described below with reference to FIGS. 1 through 5.

Figure 1:
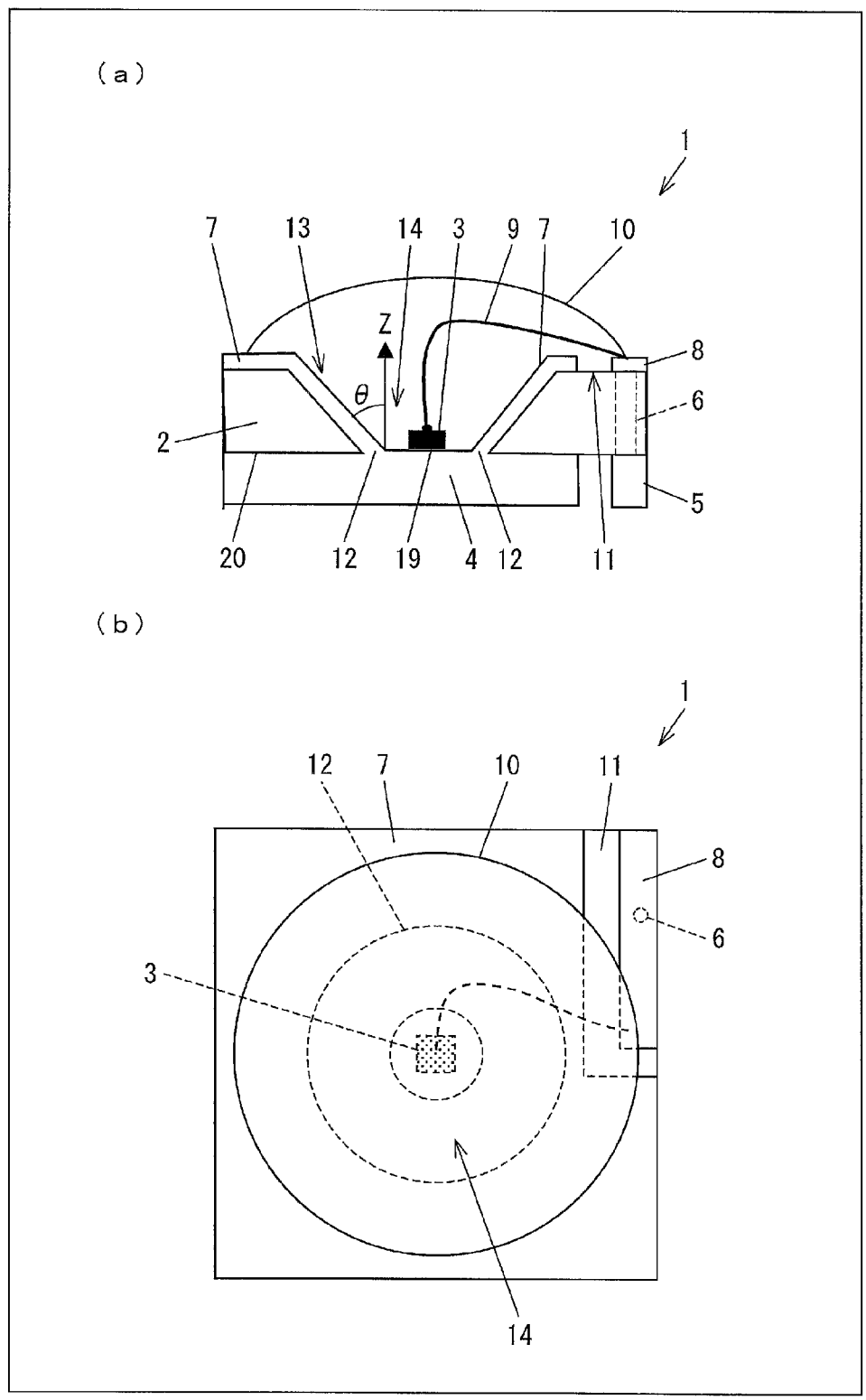
FIG. 1

FIG. 1 shows explanatory views of an LED element 1 of the present Example of the present invention. (a) of FIG. 1 is a cross-sectional view of the LED element 1 of the present Example of the present invention. (b) of FIG. 1 is a plan view of the LED element 1 of the present Example of the present invention.

The LED element 1 (light emitting diode element) is a surface-emission LED element including an LED (light-emitting diode) chip 3 (light-emitting diode chip). The LED element includes: a substrate (base material) 2; an LED chip 3; a heat dissipation plate 4 serving as an anode; a cathode terminal 5; a through hole 6; a reflecting plate 7; a conductor pattern 8; a bonding wire 9; and a sealing resin 10. The term "surface" herein refers to a surface of the heat dissipation plate 4 on which surface the sealing resin 10 is provided.

The substrate 2 is provided between the heat dissipation plate 4 and the reflecting plate. The heat dissipation plate 4 and the reflecting plate 7 are each made of a metal which is suitably a metal, such as copper and aluminum, that is high in thermal conductivity.

The LED element 1 is so structured that the LED chip 3 is provided on an upper surface of the heat dissipation plate 4. This arrangement allows heat generated by the LED chip 3 to dissipate through the heat dissipation plate 4. The cathode terminal 5 and the conductor pattern 8 are connected to each other via the through hole 6 penetrating through the substrate 2. The LED chip 3 and the conductor pattern 8 are connected (wire-bonded) to each other by the bonding wire 9. The reflecting plate 7 and the conductor pattern 8 are separated from each other by a groove 11. The plan view of (b) of FIG. 1 illustrates an L-shaped groove 11. This shape is, however, merely an example. The groove 11 simply needs to have a shape in a plan view which shape allows the reflecting plate 7 and the conductor pattern 8 to be separated from each other.

The heat dissipation plate 4 and the reflecting plate 7 are formed integrally with each other (that is, integrated with each other) by bonding at, for example, a bonding section 12 (first bonding section).

The LED chip 3 is covered by the sealing resin 10 for sealing (packaging). The sealing by the sealing resin 10 is not necessarily for only the LED chip 3, but may be for the LED chip 3, the reflecting plate 7, and the conductor pattern 8.

The LED element 1 of the present Example 1 is an LED element including a heat dissipation plate 4, and further includes a reflecting plate 7 for reflecting light emitted by the LED chip 3. This structure allows light emitted by the LED chip 3 to be reflected efficiently, and makes it possible to adjust the light distribution (that is, the distribution of light emitted by the LED element 1) by means of adjustment (that is, increasing or decreasing) of the angle θ [°] formed by (i) a normal line direction (Z direction; the direction perpendicular to an exposed surface 19 described below) and (ii) the reflecting plate 7.

The LED element 1 may be arranged such that the reflecting plate 7 is so provided as to guide, to the surface, light emitted by the LED chip 3. This arrangement allows light emitted by the LED chip 3 in any direction to be reflected efficiently.

The heat dissipation plate 4 and the reflecting plate 7 each have a surface covered by a conductor pattern 13 (conductor pattern). The conductor pattern 13 is made of copper or the like. As described above, the reflecting plate 7 is bonded, at the bonding section 12, to the exposed surface 19 of the heat dissipation plate 4 on which exposed surface the LED chip 3 is provided. The heat dissipation plate 4 and the substrate 2 are bonded to each other at a bonding section 20 (second bonding section). The bonding section 12 and the bonding section 20 allow a heat dissipation section that is larger in volume than that of a conventional LED element, and thus allow the heat capacity to be larger than that of a conventional LED element. This arrangement can consequently increase heat dissipation (that is, cause heat to escape from the package) with use of a synergistic effect of (i) the heat dissipation effect by the bonding section 12 and (ii) the heat dissipation effect by the bonding section 20.

The LED element 1, which can dissipate heat efficiently as described above, can prevent heat from being present locally and thus disperse heat.

The bonding section 20, at which the heat dissipation plate 4 and the substrate 2 are bonded to each other, may be subjected to plating or may include metal plates attached to each other.

The LED chip 3 is placed at the center of a hole 14 in the substrate 2. The LED chip 3 is wire-bonded with use of the bonding wire 9. The LED chip 3 has a light-emitting surface 15 (see (b) of FIG. 2) that is sealed with the sealing resin 10. The sealing resin 10 is, for example, a transparent epoxy resin.

Figure 2:
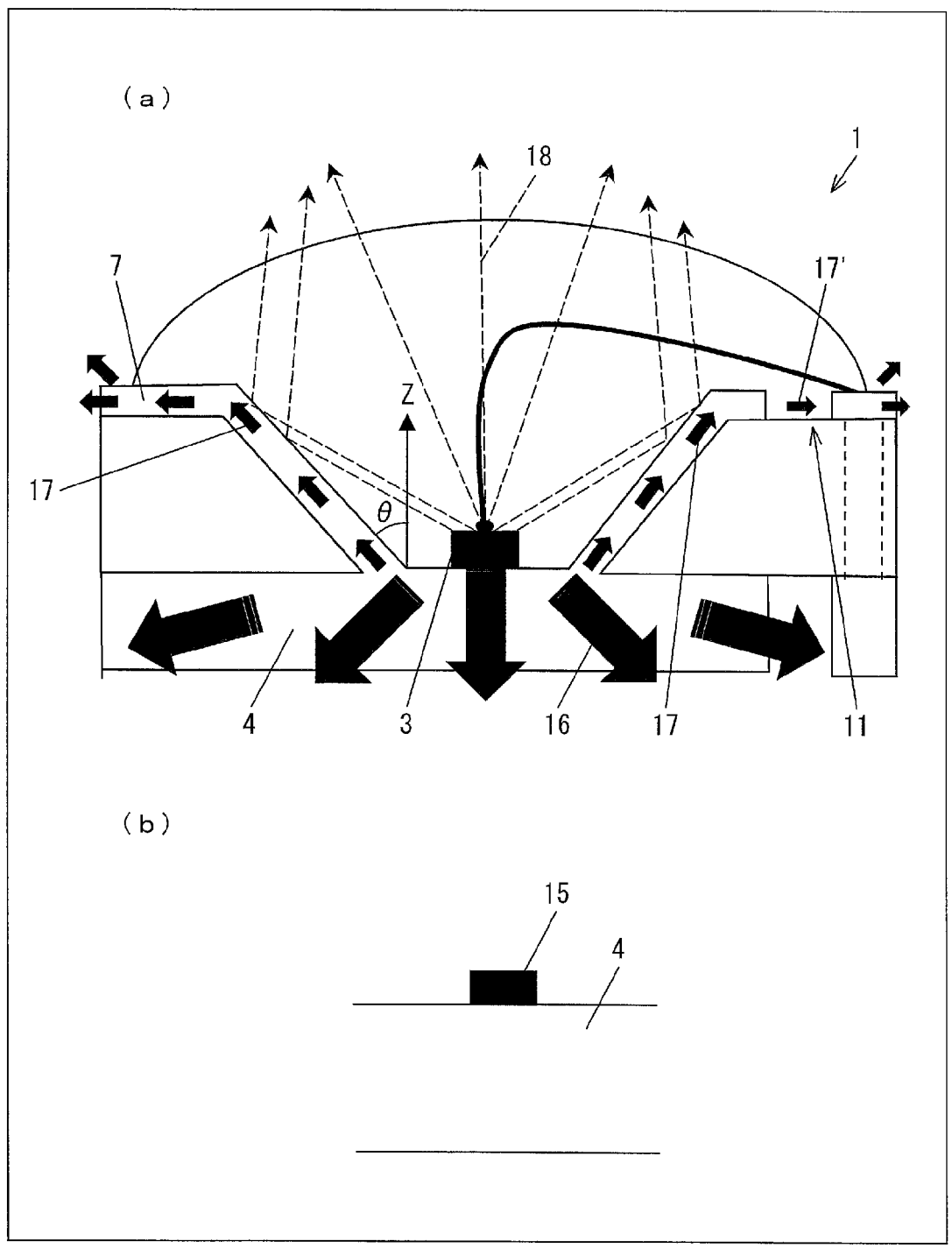
FIG. 2

FIG. 2 shows explanatory views of the LED element 1 of Example 1 of the present invention. (a) of FIG. 2 is a cross-sectional view of the LED element 1 of Example 1 of the present invention, and illustrates how heat is dissipated in the LED element 1. (b) of FIG. 2 is a partial enlarged view of the LED element 1, the partial enlarged view illustrating a light-emitting surface 15 of the LED chip 3. The LED element 1 causes light to be emitted as indicated by the short-dashed arrows 18 in (a) of FIG. 2.

The LED element 1 is structured such that heat is dissipated, as indicated by the arrows 16 and 17 in (a) of FIG. 2, through the heat dissipation plate 4 and the reflecting plate 7 located in the vicinity of the LED chip 3. A larger area or thickness of the metal increases heat dissipation. (a) of FIG. 2 illustrates arrows 16 and 17 and an arrow 17' referred to below each having a size indicative of the degree of heat dissipation. Thus, a portion with a larger arrow is larger in the amount of heat dissipation.

(a) of FIG. 2 shows the arrows 16 and 17 to indicate a path of heat dissipation in the LED element 1, and illustrates a groove 11 provided (i) at a portion of the LED element and (ii) to the right of the reflecting plate 7 with respect to the surface of FIG. 2. With the groove 11 sealed with the sealing resin 10, a portion of the LED element which portion is located to the left of the reflecting plate 7 with respect to the surface of FIG. 2 allows heat to be dissipated (that is, to escape) more readily than a portion of the LED element which portion is located to the right of the reflecting plate 7 with respect to the surface of FIG. 2. The portion located to the right of the reflecting plate 7 with respect to the surface of FIG. 2 includes a portion indicated by the arrow 17' which portion causes heat to be dissipated through the sealing resin 10 in the groove 11. The portion indicated by the arrow 17' is thus smaller in the amount of heat dissipation than a portion indicated by an arrow 17.

The above arrangement facilitates controlling the light distribution of the LED element 1 on the basis of (i) the angle θ [degrees] formed by the normal line direction (Z direction) and the reflecting plate 7 and (ii) the shape of the reflecting plate 7. (a) and (b) of FIG. 4 each illustrate a graph indicative of the above light distribution, the graph indicating (i) the angle θ along its abscissa and (ii) the luminous intensity (unit: cd [candela]) along its ordinate.

Figure 3:
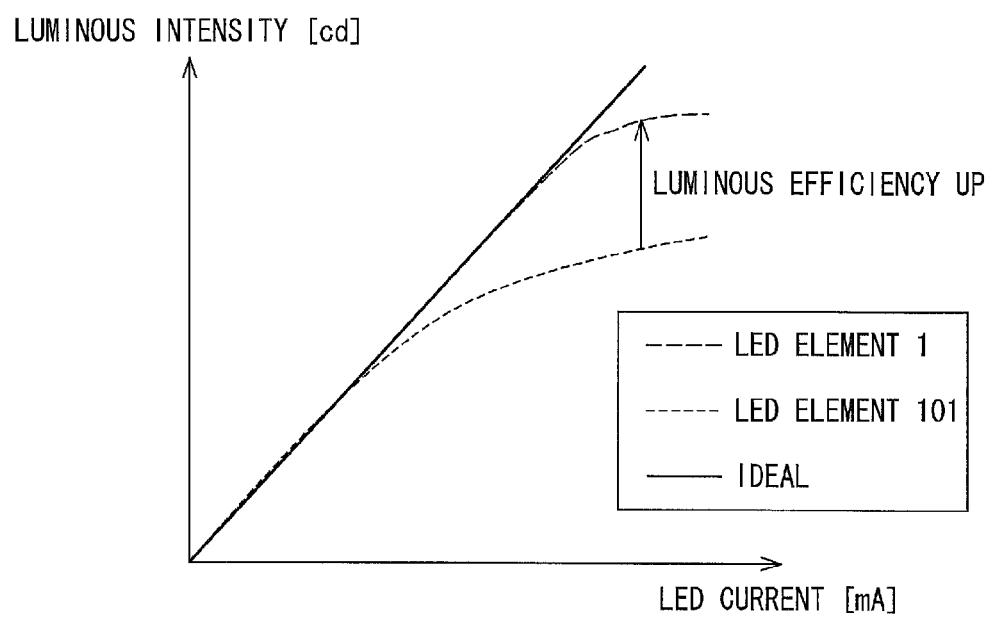
FIG. 3

FIG. 3 is a graph indicating that the luminous efficiency is increased in the LED element 1 of Example 1 of the present invention. The graph of FIG. 3 indicates (i) along its abscissa, an LED current (unit: mA (milliampere), for example) through the LED element 1 and (ii) along its ordinate, the luminous intensity. The LED current flows in the LED element 1 through the path of the heat dissipation plate 4 (anode), the LED chip 3, the bonding wire 9, the conductor pattern 8, the through hole 6, and the cathode terminal 5.

Figure 12:
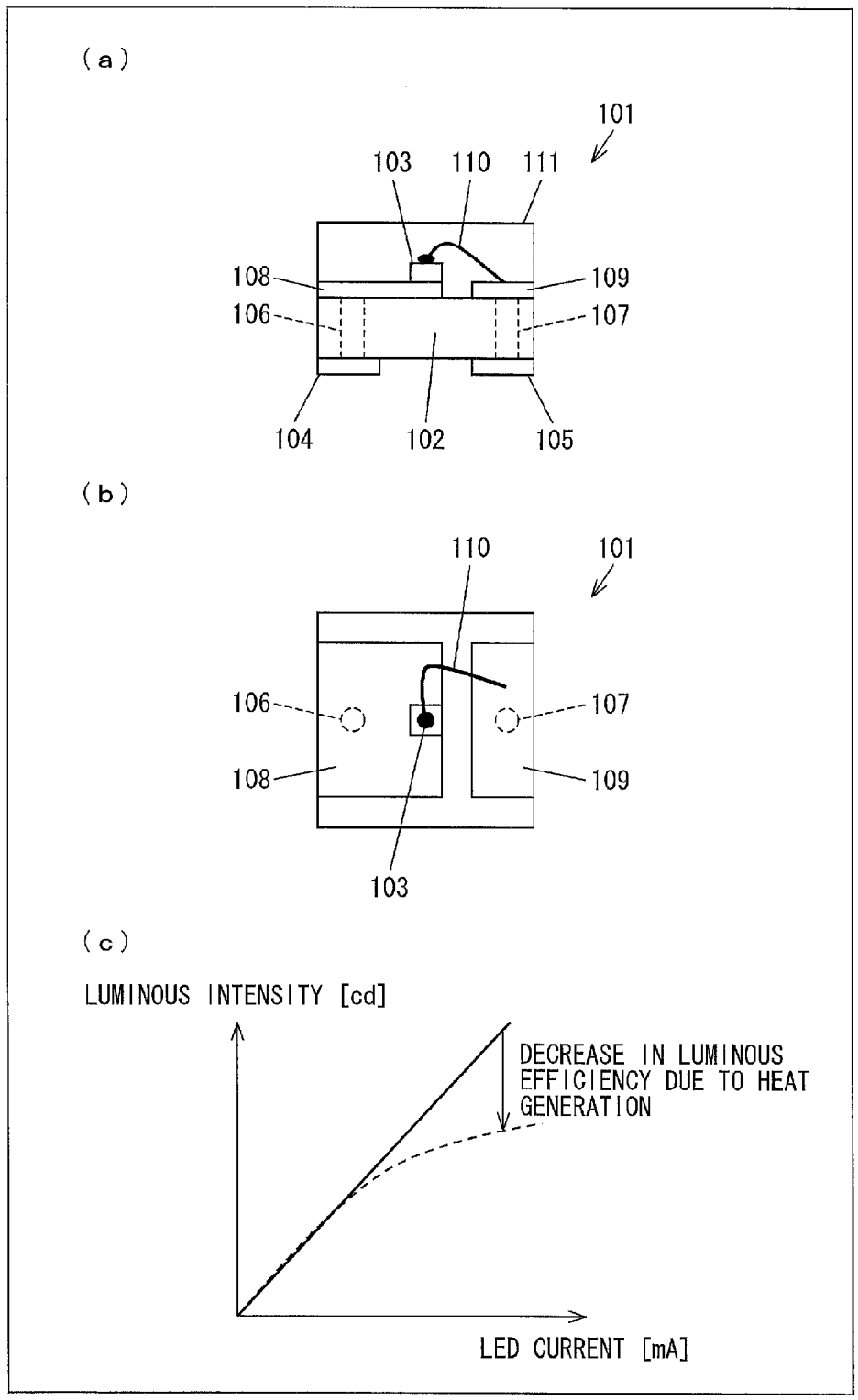
FIG. 12

The LED element 1 dissipates heat through the heat dissipation plate 4 and the reflecting plate 7, which are located in the vicinity of the LED chip 3. The LED element, which is larger in metal area than the conventional LED element 101 of FIG. 12, has an accordingly improved heat dissipation property.

The LED element can thus further prevent heat generation than by the conventional LED element 101. The LED element consequently has an increased luminous efficiency. In other words, the LED element is higher in luminous efficiency and has a reduced power consumption. Further, since the LED element can prevent heat generation, the LED element has a life longer than that of the conventional LED element 101.

The improved heat dissipation property allows a maximum rated current value for the LED element 1 to be set to a high value. This in turn increases the luminous intensity of the LED element, and consequently increases its luminance.

Figure 4:
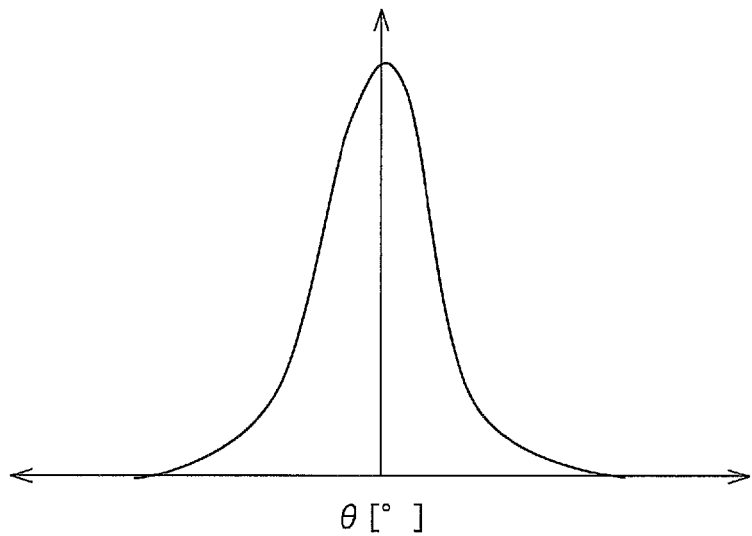
FIG. 4
Figure 4:
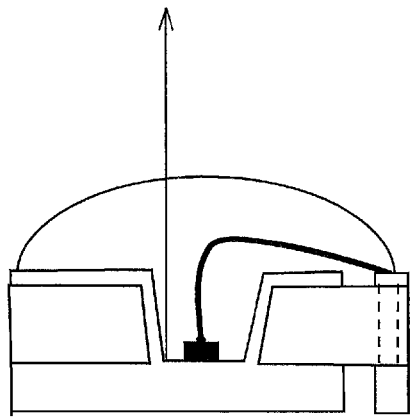
Figure 5:
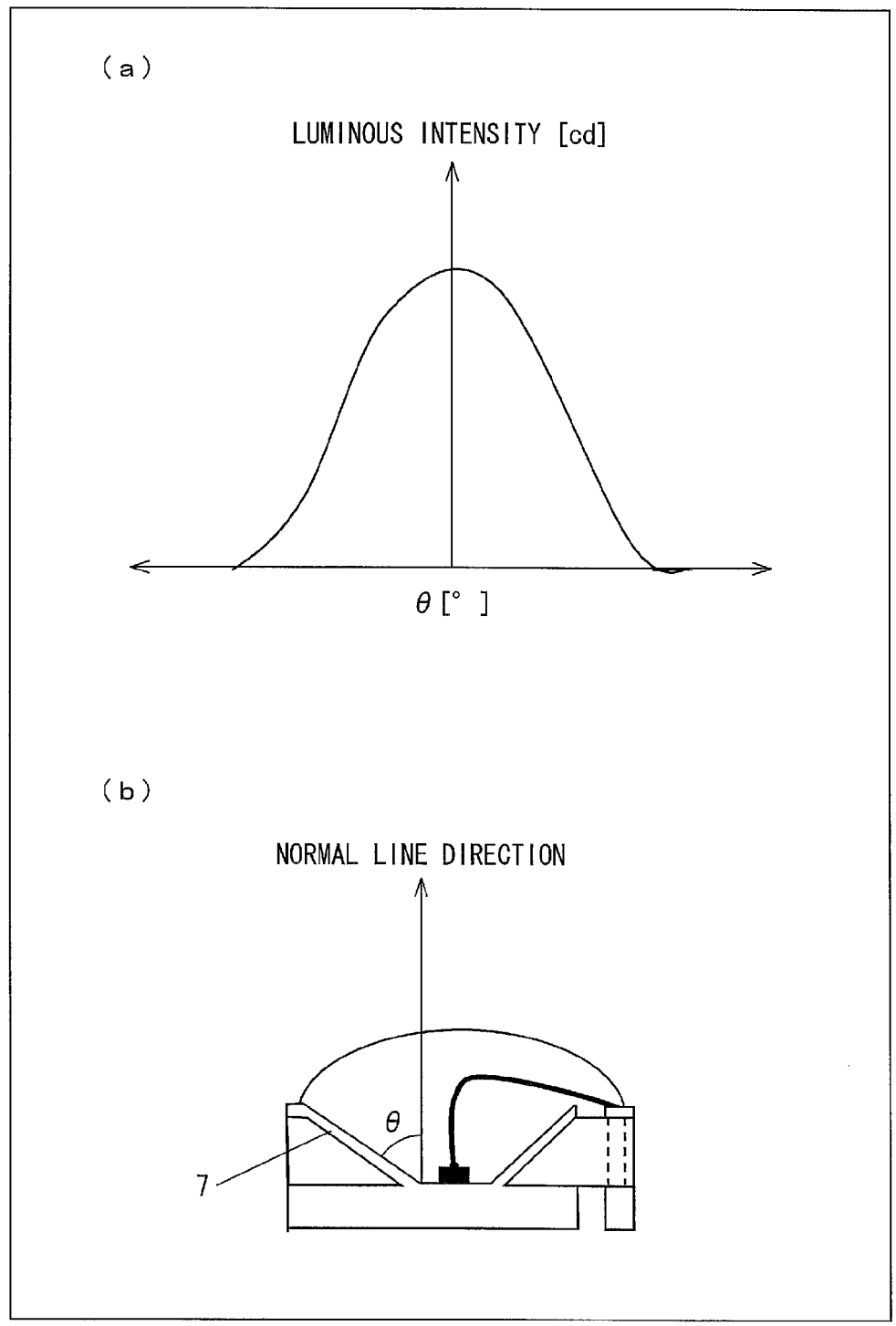
FIG. 5

FIG. 4 shows explanatory diagrams each illustrating a light distribution for a case in which the LED element 1 of Example 1 of the present invention has a smaller angle θ. (a) of FIG. 4 is a graph illustrating a light distribution for the case in which the LED element 1 of Example 1 of the present invention has a smaller angle θ as illustrated in (b) of FIG. 4. FIG. 5 shows explanatory diagrams each illustrating a light distribution for a case in which the LED element 1 of Example 1 of the present invention has a larger angle θ. (a) of FIG. 5 is a graph illustrating a light distribution for the case in which the LED element 1 of Example 1 of the present invention has a larger angle θ as illustrated in (b) of FIG. 5.

A smaller angle θ with respect to the normal line direction results in a higher directivity in the light distribution as illustrated in the graph of (a) of FIG. 4. On the other hand, a smaller angle θ with respect to the normal line direction results in a lower directivity in the light distribution as illustrated in the graph of (a) of FIG. 5.

The LED element 1 structurally differs from a conventional LED element in that a cross section around the LED chip is formed uniformly on an identical plane due to the reflecting plate 7.

The LED element 1 is arranged such that (i) its surface is covered by the metallic reflecting plate 7 and that (ii) the reflecting plate 7 and the heat dissipation plate 4 are bonded to each other at the bonding section 12.

The LED element does not require, in terms of its cross-sectional structure, members disclosed in Patent Literature 1, such as a resist member, an ink member, a frame member, and an adhesive.

The LED element allows free design for a light distribution.

The LED element 1 can reduce a light reflection loss in itself, and can thus achieve a high luminous efficiency.

The LED element can secure a large heat dissipation area for greater heat dissipation. This arrangement can improve reliability by, for example, preventing the luminous efficiency from decreasing due to heat generated at the time of light emission.

EXAMPLE 2

A second Example of the present invention is described below with reference to FIG. 6. The present Example 2 involves an arrangement which is identical to that of the above Example 1 except for the points described in the present Example 2. For convenience of explanation, members of the present Example that are identical in function to respective corresponding members illustrated in the drawings referred to in Example 1 above are each assigned a common reference numeral, and are not described here.

Figure 6:
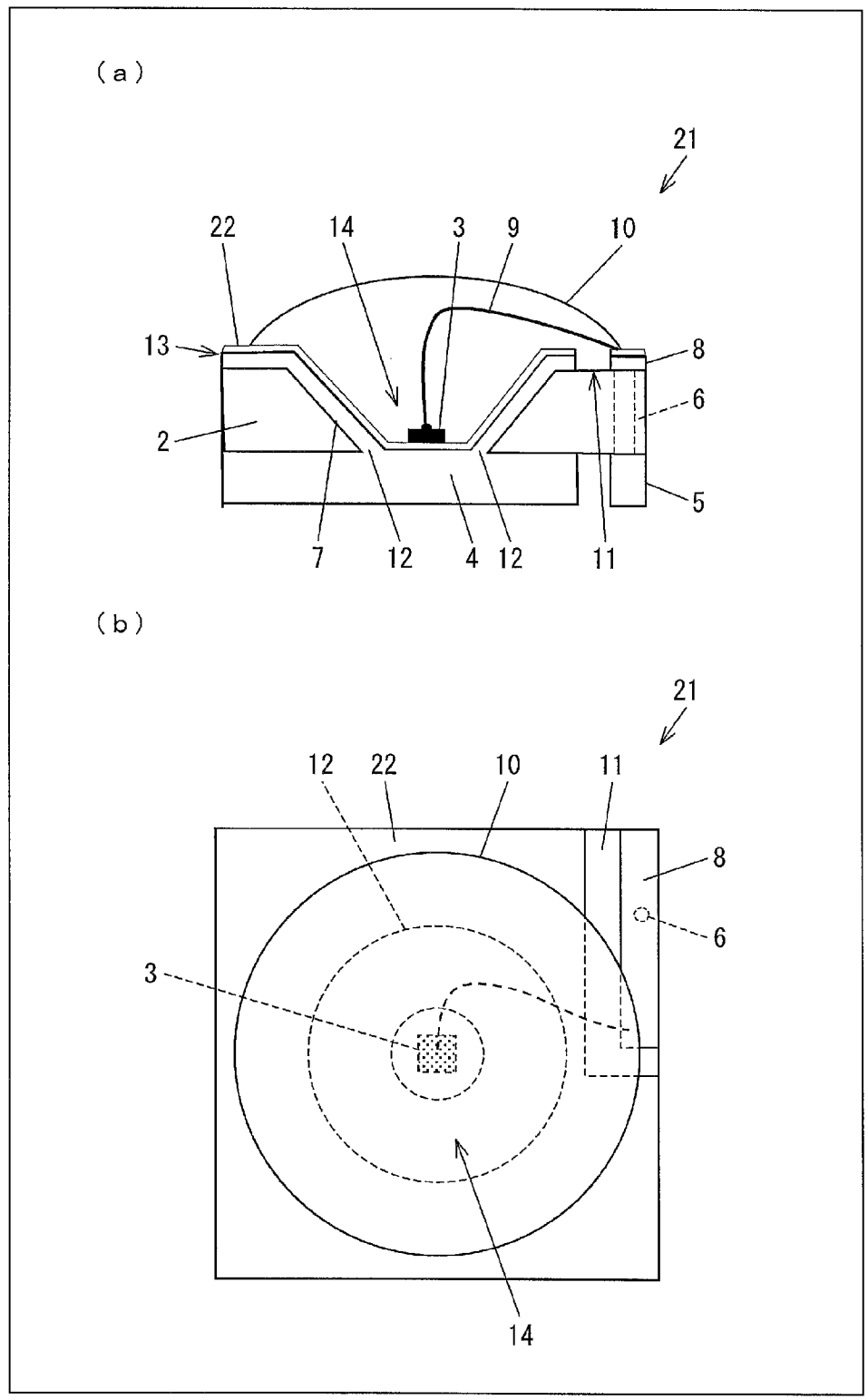
FIG. 6

FIG. 6 shows explanatory views each illustrating an LED element 21 of the second Example of the present invention. (a) of FIG. 6 is a cross-sectional view of the LED element 21 of the second Example of the present invention. (b) of FIG. 6 is a plan view of the LED element 21 of the second Example of the present invention. The LED element 21 of the present Example 2 differs from the LED element 1 of Example 1 on the points below.

The LED element 21 is arranged such that the conductor pattern 13 provided on the surface of the reflecting plate 7 is provided with a high-reflectance plating 22 (plating) that is high in light reflectance. In other words, the LED element 21 is so structured that the reflecting plate 7, the conductor pattern 13, and the high-reflectance plating 22 are stacked on top of one another in that order. The present embodiment assumes a light reflectance of not less than 60% and not greater than 90% to be high in light reflectance (that is, high reflectance). This is, however, merely an example.

Providing the high-reflectance plating 22 to the conductor pattern 13 on the reflecting plate 7 can increase the reflectance of the reflecting plate 7. This in turn increases the luminous efficiency and reduces power consumption. The high-reflectance plating 22 is made of, for example, Ag (silver) or Au (gold).

EXAMPLE 3

A third Example of the present invention is described below with reference to FIG. 7. The present Example 3 involves an arrangement which is identical to those of the above Examples 1 and 2 except for the points described in the present Example 3. For convenience of explanation, members of the present Example that are identical in function to respective corresponding members illustrated in the drawings referred to in Examples 1 and 2 above are each assigned a common reference numeral, and are not described here.

Figure 7:
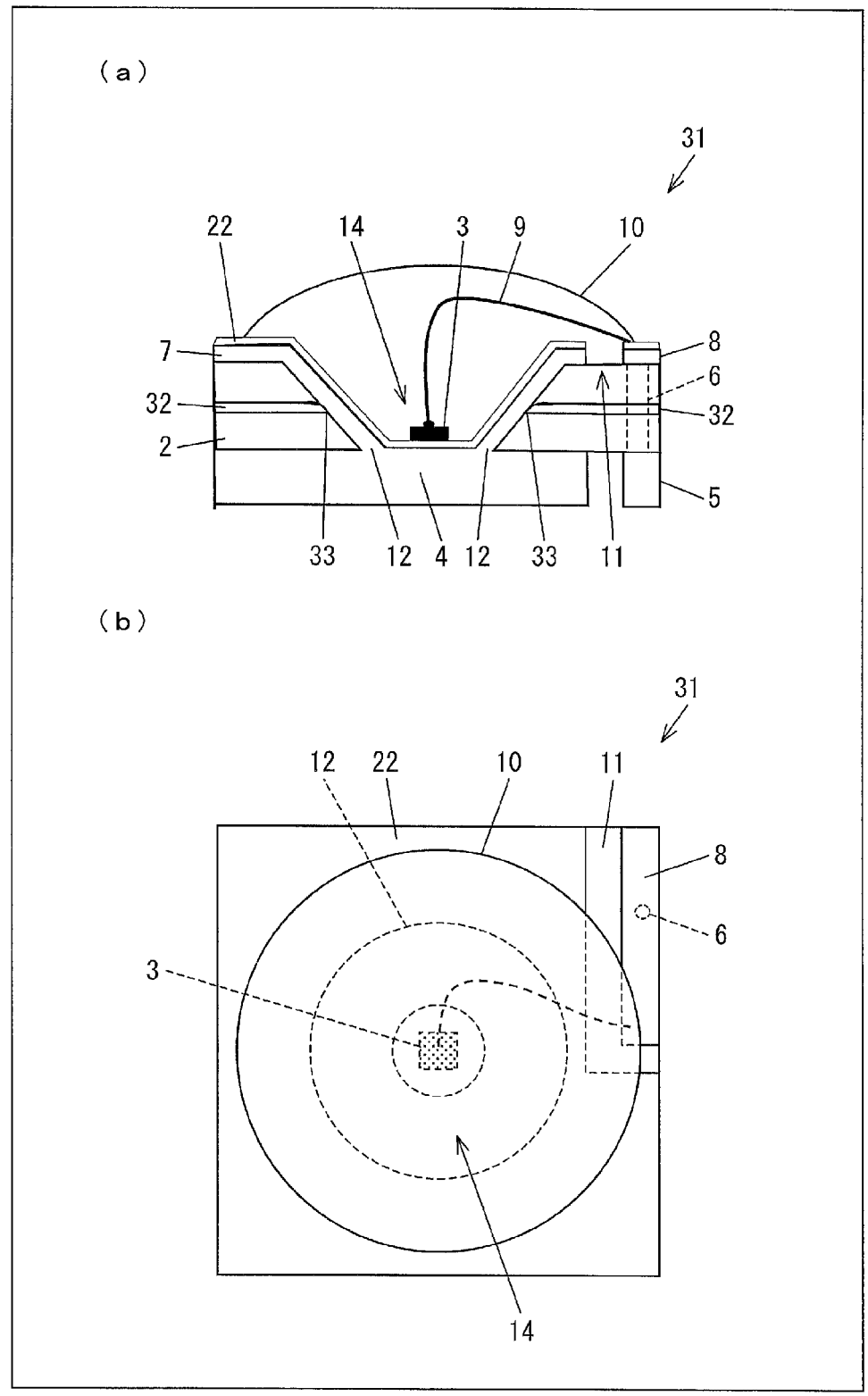
FIG. 7

FIG. 7 shows explanatory views each illustrating an LED element 31 of the third Example of the present invention. (a) of FIG. 7 is a cross-sectional view of the LED element 31 of the third Example of the present invention. (b) of FIG. 7 is a plan view of the LED element 31 of the third Example of the present invention. The LED element 31 of the present Example 3 differs from the LED element 21 of Example 2 on the points below.

The LED element 31 includes at least one inner-layer conductor pattern 32 provided inside the substrate 2. The inner-layer conductor pattern 32 is bonded to the reflecting plate 7 at a bonding section 33 (third bonding section). This arrangement further increases the area of a portion that dissipates heat, and can thus improve heat dissipation (that is, further increase the heat dissipation effect). This arrangement also improves the heat dissipation property and thus reduces a package damage to the LED element 31.

The LED element desirably includes a larger number of the inner layer, that is, the inner-layer conductor patterns 32. The inner-layer conductor pattern 32 is desirably made of a metal that is high in thermal conductivity (for example, copper or aluminum). The inner-layer conductor pattern 32 is preferably thick. The heat dissipation effect can be increased further by providing the inner-layer conductor pattern 32 arranged under an appropriate combination of the above conditions.

EXAMPLE 4

A fourth Example of the present invention is described below with reference to FIG. 8. The present Example 4 involves an arrangement which is identical to those of the above Examples 1 through 3 except for the point described in the present Example 4. For convenience of explanation, members of the present Example that are identical in function to respective corresponding members illustrated in the drawings referred to in Examples 1 through 3 above are each assigned a common reference numeral, and are not described here.

Figure 8:
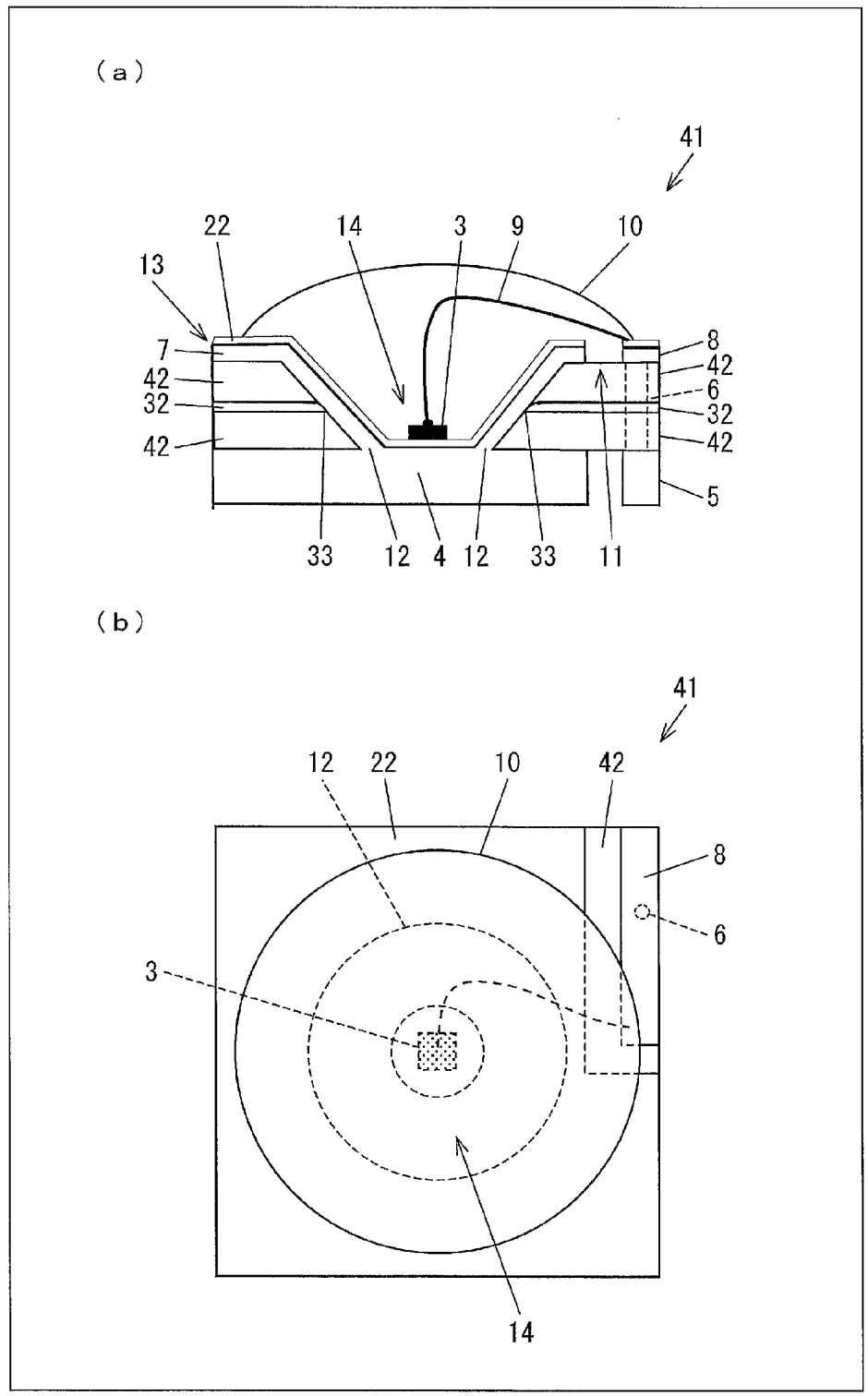
FIG. 8

FIG. 8 shows explanatory views each illustrating an LED element 41 of the fourth Example of the present invention. (a) of FIG. 8 is a cross-sectional view of the LED element 41 of the fourth Example of the present invention. (b) of FIG. 8 is a plan view of the LED element 41 of the fourth Example of the present invention. The LED element 41 of the present Example 4 differs from the LED element 31 of Example 3 on the point below.

The LED element 41 includes a substrate 42, which corresponds to the substrate 2 of Examples 1 through 3 and which includes a filler inside the substrate 2. The filler improves heat conduction of the substrate 42 and thus improves heat dissipation of the substrate 42 itself, thereby further improving heat dissipation of the LED element. The present embodiment further improves the heat dissipation property and thus reduces a package damage to the LED element 41.

EXAMPLE 5

A fifth Example of the present invention is described below with reference to FIG. 9. The present Example 5 involves an arrangement which is identical to those of the above Examples 1 through 4 except for the point described in the present Example 5. For convenience of explanation, members of the present Example that are identical in function to respective corresponding members illustrated in the drawings referred to in Examples 1 through 4 above are each assigned a common reference numeral, and are not described here.

Figure 9:
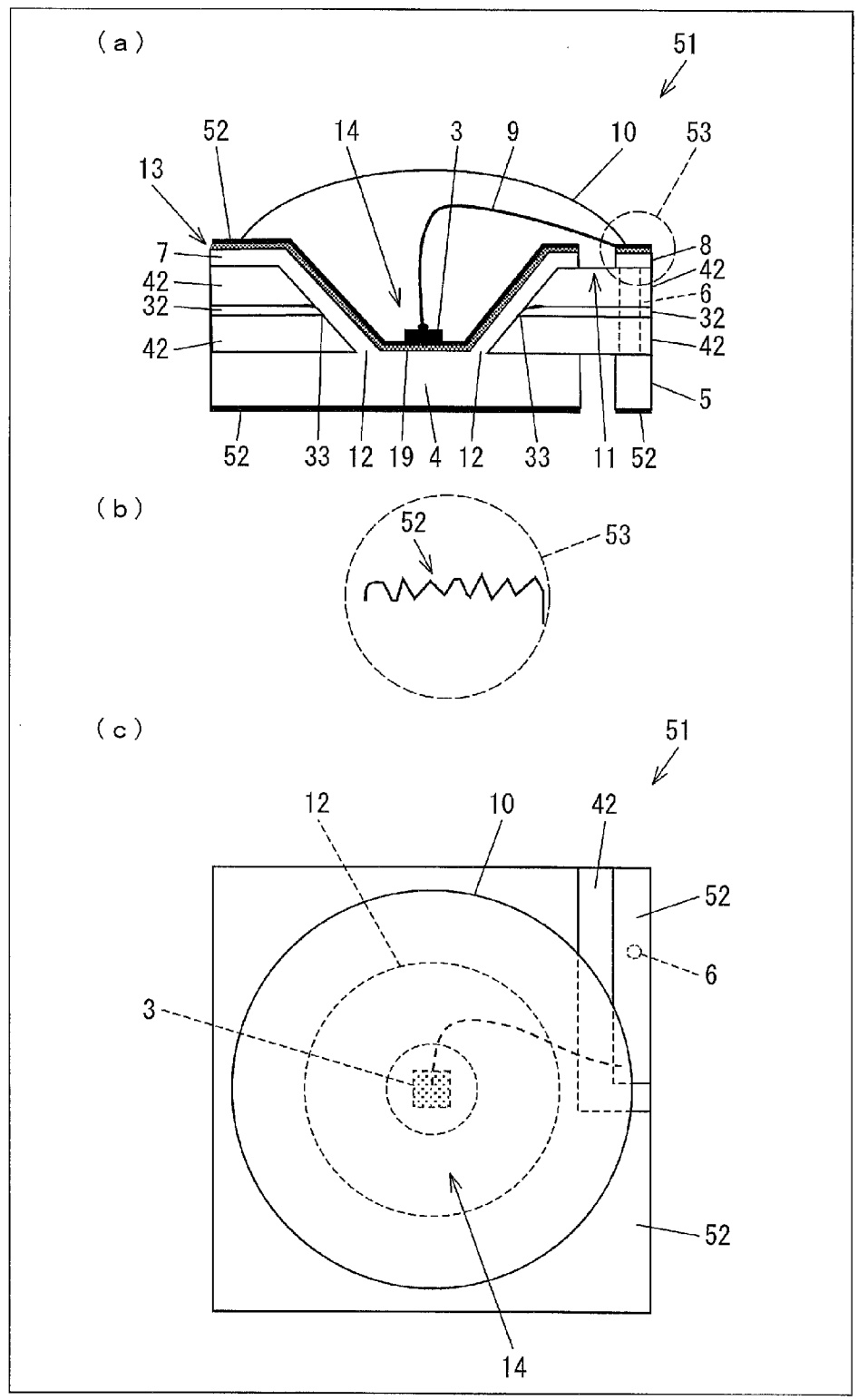
FIG. 9

FIG. 9 shows explanatory views each illustrating an LED element 51 of the fifth Example of the present invention. (a) of FIG. 9 is a cross-sectional view of the LED element 51 of the fifth Example of the present invention. (b) of FIG. 9 is a partial enlarged view of a portion of the LED element 51 of the fifth Example of the present invention which portion has been subjected to a surface roughening treatment 52. (c) of FIG. 8 is a plan view of the LED element 51 of the fifth Example of the present invention. The LED element 51 of the present Example 5 differs from the LED element 41 of Example 4 on the point below.

The LED element 51 is, instead of being provided with a high-reflectance plating 22 as in the LED element 41 of Example 4, subjected to a surface roughening treatment 52 (see (b) of FIG. 9) on the exposed surface 19 of the conductor pattern 13 and the heat dissipation plate 4. The surface roughening treatment 52 is provided also for a surface (back side) of the heat dissipation plate 4 on which surface the sealing resin 10 is not provided. (b) of FIG. 9 is an enlarged view of the portion indicated by the short-dashed circle 53 in (a) of FIG. 9. Providing the surface roughening treatment 52 increases the surface area of the portion for which the surface roughening treatment 52 has been provided, and thus further increases the heat dissipation effect.

EXAMPLE 6

A sixth Example of the present invention is described below with reference to FIG. 10. The present Example 6 involves an arrangement which is identical to those of the above Examples 1 through 5 except for the points described in the present Example 6. For convenience of explanation, members of the present Example that are identical in function to respective corresponding members illustrated in the drawings referred to in Examples 1 through 5 above are each assigned a common reference numeral, and are not described here.

Examples 1 through 5 each include a single LED element provided on a single substrate 2. The present invention is, however, not limited to such an arrangement. A plurality of LED elements may thus be provided on a single substrate (multiple provision).

Figure 10:
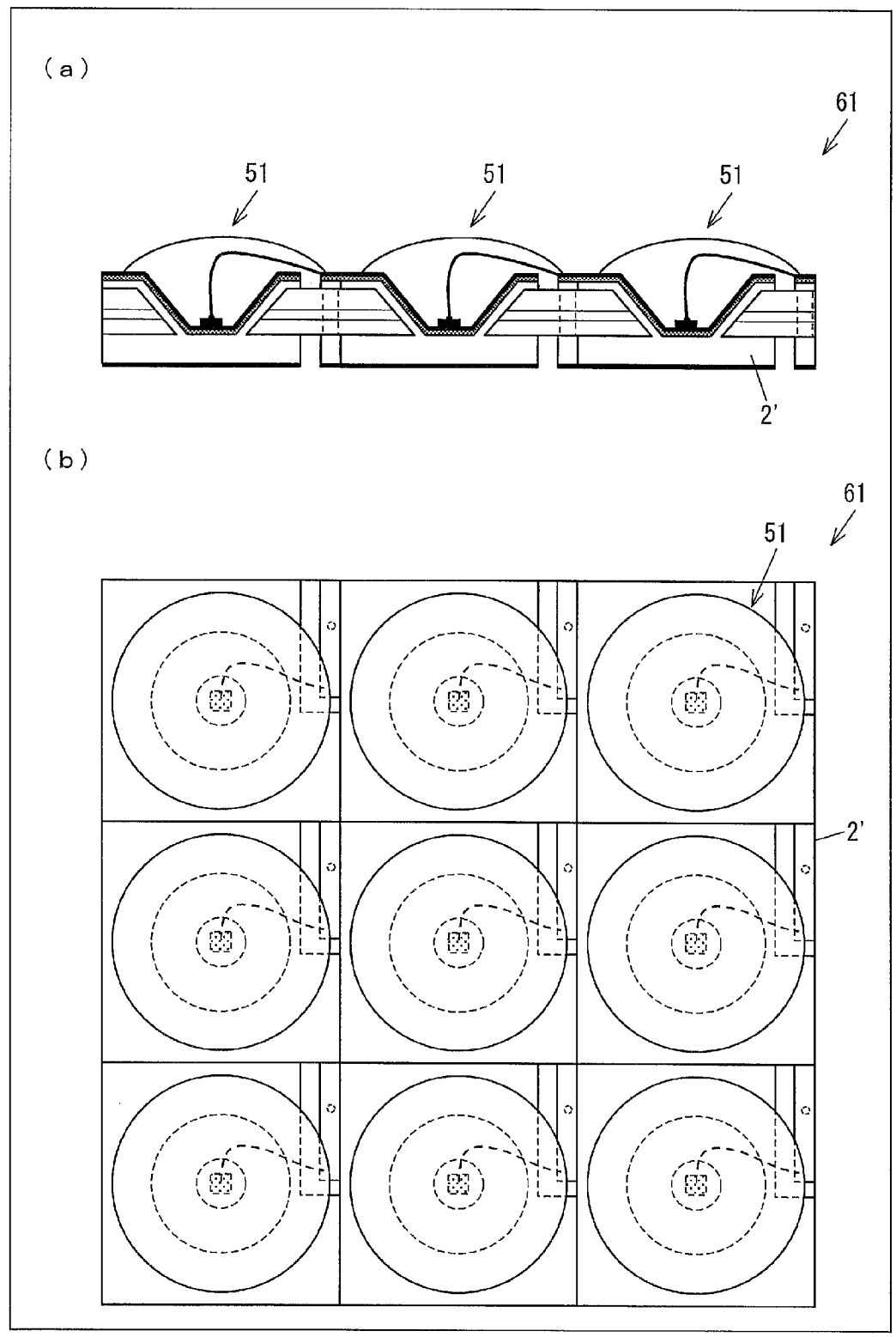
FIG. 10

FIG. 10 shows explanatory views each illustrating a light source 61 including a plurality of LED elements 51 (Example 5) provided on an identical substrate 2' (that is, on a single substrate). (a) of FIG. 10 is a cross-sectional view of a light source 61 (light source device) including a plurality of LED elements 51 (Example 5) provided on an identical substrate 2' (that is, on a single substrate). (b) of FIG. 10 is a plan view of the light source 61.

The light source 61 includes, as an example, LED elements 51 of Example 5 as the plurality of LED elements. This is, however, merely an example. The plurality of LED elements may alternatively be, instead of LED elements 51, LED elements 1, 21, 31, or 41 of Example 1 through Examples 4. The plurality of LED elements may further alternatively include a mix of two or more kinds of LED elements. For instance, the light source may include an LED element 31 and an LED element 51 (in other words, a mix of the LED elements 31 and 51) provided on an identical substrate 2'.

The light source 61 is a single light source (a light source including a single substrate, that is, an identical substrate 2')

including a plurality of LED elements. This light source can be higher in luminance than a light source including only one LED element.

Further, this light source, which includes a plurality of LED elements provided on an identical substrate 2', involves a fewer number of substrates and production steps than for a light source including a large number of independent LED elements. This makes it possible to reduce costs.

EXAMPLE 7

A seventh Example of the present invention is described below with reference to FIG. 11. The present Example 7 involves an arrangement which is identical to those of the above Examples 1 through 6 except for the points described in the present Example 7. For convenience of explanation, members of the present Example that are identical in function to respective corresponding members illustrated in the drawings referred to in Examples 1 through 6 above are each assigned a common reference numeral, and are not described here.

The present Example 7 describes a surface light source illumination device 71 and a liquid crystal display device 72 each including the LED elements of Examples 1 through 5 and the light source 61 of Example 6.

Figure 11:
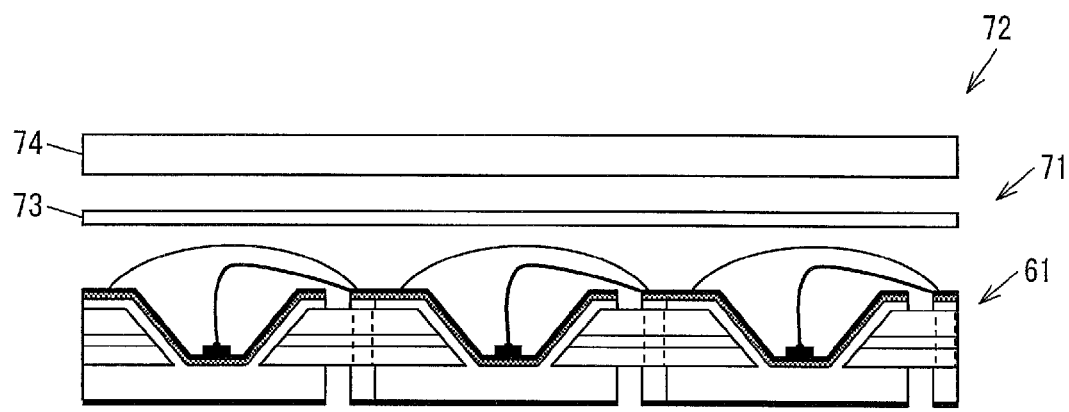
FIG. 11

FIG. 11 is a cross-sectional view illustrating a surface light source illumination device 71 and a liquid crystal display device 72 each according to the seventh Example of the present invention.

The surface light source illumination device 71 includes the light source 61 and an optical sheet 73. The light source 61 emits light onto a back surface of the optical sheet 73, which then uniformizes the distribution of the light. This arrangement thus allows the surface light source illumination device 71 to emit planar light.

The liquid crystal display device 72 includes the light source 61, the optical sheet 73, and a liquid crystal display panel 74. In other words, the liquid crystal display device 72 includes the surface light source illumination device 71 and the liquid crystal display panel 74. The liquid crystal display panel 74 is provided on an upper surface of the surface light source illumination device 71. This arrangement allows the liquid crystal display device 72 to display a still image or a moving image.

The present Example may alternatively be arranged such that (i) the liquid crystal display panel 74 is capable of being driven for each region including a plurality of pixels and that (ii) the surface light source illumination device 71 has a luminance that is adjustable for each region including a plurality of pixels.

The surface light source illumination device 71 and the liquid crystal display device 72 each include a single optical sheet 73, which may alternatively be replaced by an optical sheet group including a plurality of optical sheets stacked on one another.

The light emitting diode element may be arranged such that the reflecting plate is provided so as to guide the light, emitted from the light-emitting diode chip, to the surface of the reflecting plate. This arrangement allows light emitted by the light-emitting diode chip in any direction to be reflected efficiently.

The light emitting diode element may be arranged such that the conductor pattern is provided with a silver plating or a gold plating. This plating can further increase the reflectance of the reflecting plate. The plating thus further increases the luminous efficiency and leads to reduction of power consumption.

The light emitting diode element may be arranged such that at least one inner-layer conductor pattern is provided inside the substrate; and the at least one inner-layer conductor pattern and the reflecting plate are bonded to each other at a third bonding section.

This arrangement further increases the area of a portion that dissipates heat, and improves heat dissipation (that is, further increases the heat dissipation effect). The above arrangement further improves the heat dissipation property, and thus reduces a package damage to the light emitting diode element.

The light emitting diode element may be arranged such that the substrate includes a filler. The filler improves heat conduction of the substrate and thus improves heat dissipation of the substrate itself, thereby further improving heat dissipation of the light emitting diode element. The above arrangement further improves the heat dissipation property and thus reduces a package damage to the light emitting diode element.

The light emitting diode element may be arranged such that the conductor pattern has been subjected to a surface roughening treatment. Providing the surface roughening treatment increases the surface area of the portion for which the surface roughening treatment has been provided, and thus further increases the heat dissipation effect.

A light source device of the present invention includes: on a single substrate, a plurality of any of the light emitting diode elements.

The above light source device is a light source including a single substrate and a plurality of the light emitting diode element. The light source device is thus higher in luminance than a single one of the light emitting diode element.

Further, the above light source device, which includes the light emitting diode elements provided on the single substrate, involves a fewer number of substrates and production steps than for a light source including a large number of independent light emitting diode elements. This makes it possible to reduce costs.

A surface light source illumination device of the present invention includes: the light source device; and an optical sheet, the light source device emitting light from a side of a back surface of the optical sheet, the optical sheet uniformizing a light distribution. This arrangement allows the surface light source illumination device to emit planar light.

A liquid crystal display device of the present invention includes: the surface light source illumination device; and a liquid crystal display panel provided on an upper surface of the surface light source illumination device. This arrangement allows the liquid crystal display device to display a still image or a moving image.

The present invention is not limited to the description of the Examples above, but may be altered in various ways by a skilled person within the scope of the claims. Any embodiment based on a proper combination of technical means disclosed in different Examples is also encompassed in the technical scope of the present invention.

INDUSTRIAL APPLICABILITY

The light emitting diode element of the present invention, which has (i) an adjustable orientation distribution and (ii) high heat dissipation and high luminous efficiency, can suitably be used in a liquid crystal display device.

REFERENCE SIGNS LIST 1, 21, 31, 41, 51 LED element (light emitting diode element)
2, 42 substrate
2' identical substrate (single substrate)
3 LED chip (light-emitting diode chip)
4 heat dissipation plate
5 cathode terminal
6 through hole
7 reflecting plate
8 conductor pattern
9 bonding wire
10 sealing resin
11 groove
12 bonding section (first bonding section)
13 conductor pattern (conductor pattern)
14 hole
15 light-emitting surface
16, 17, 17' arrow
18 short-dashed arrow
19 surface
20 bonding section (second bonding section)
22 high-reflectance plating (plating)
32 inner-layer conductor pattern
33 bonding section (third bonding section)
52 surface roughening treatment
53 short-dashed circle
61 light source (light source device)
71 surface light source illumination device
72 liquid crystal display device
73 optical sheet
74 liquid crystal display panel
θ angle

The invention claimed is:

1. A surface-emission light emitting diode element comprising:
a light-emitting diode chip;
a heat dissipation plate that includes an upper surface on which the light-emitting diode chip is provided and that dissipates heat generated by the light-emitting diode chip;
a reflecting plate arranged to reflect light emitted from the light-emitting diode chip; and
a substrate provided between the heat dissipation plate and the reflecting plate, wherein
the heat dissipation plate and the reflecting plate are integrally bonded together at a first bonding section,
the heat dissipation plate and the substrate are bonded to each other at a second bonding section,
the heat dissipation plate and the reflecting plate include respective surfaces both covered by a conductor pattern,
at least one inner-layer conductor pattern is provided inside the substrate, a portion of the substrate being arranged between the reflecting plate and the at least one inner-layer conductor pattern, and
the at least one inner-layer conductor pattern and the reflecting plate are bonded to each other at a third bonding section, the third bonding section being located on an inner side surface of the at least one inner-layer conductor pattern which defines a hole.

2. The light emitting diode element according to claim 1, wherein:
the reflecting plate is provided so as to guide the light, emitted from the light-emitting diode chip, to the surface of the reflecting plate.

3. The light emitting diode element according to claim 1, wherein:
the conductor pattern is provided with a silver plating or a gold plating.

4. The light emitting diode element according to claim 1, wherein:
the substrate includes a filler.

5. The light emitting diode element according to claim 1, wherein:
the conductor pattern has been subjected to a surface roughening treatment.

6. A light source device comprising:
on a single substrate, a plurality of the light emitting diode element according to claim 1.

7. A surface light source illumination device comprising:
the light source device according to claim 6; and
an optical sheet,
the light source device emitting light from a side of a back surface of the optical sheet,
the optical sheet uniformizing a light distribution.

8. A liquid crystal display device comprising:
the surface light source illumination device according to claim 7; and
a liquid crystal display panel provided on an upper surface of the surface light source illumination device according to claim 7.

* * * * *